United States Patent
Marques

(10) Patent No.: US 10,454,420 B2
(45) Date of Patent: Oct. 22, 2019

(54) CRYSTAL DRIVER CIRCUIT CONFIGURABLE FOR DAISY CHAINING

(71) Applicant: SILICON LABORATORIES INC., Austin, TX (US)

(72) Inventor: Tiago Marques, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 175 days.

(21) Appl. No.: 15/645,684

(22) Filed: Jul. 10, 2017

(65) Prior Publication Data

US 2019/0006992 A1 Jan. 3, 2019

Related U.S. Application Data

(60) Provisional application No. 62/527,461, filed on Jun. 30, 2017.

(51) Int. Cl.
*H03B 5/36* (2006.01)
*H03F 3/72* (2006.01)

(52) U.S. Cl.
CPC ............ *H03B 5/366* (2013.01); *H03B 5/364* (2013.01); *H03F 3/72* (2013.01); *H03B 2200/004* (2013.01); *H03B 2200/005* (2013.01); *H03B 2200/0034* (2013.01); *H03B 2200/0062* (2013.01); *H03B 2200/0066* (2013.01)

(58) Field of Classification Search
CPC . H03B 5/32; H03B 5/36; H03B 5/364; H03B 5/362; H03B 2200/0012; H03B 2200/0026; H03B 2200/0034; H03B 2200/0046; G06F 1/06; H03F 3/72
See application file for complete search history.

(56) References Cited

U.S. PATENT DOCUMENTS

| | | |
|---|---|---|
| 4,321,562 A | 3/1982 | Igarashi |
| 4,896,122 A | 1/1990 | Tahernia et al. |
| 4,956,618 A | 9/1990 | Ulmer |
| 5,041,802 A | 8/1991 | Wei et al. |
| 5,208,558 A | 5/1993 | Shigehara et al. |

(Continued)

OTHER PUBLICATIONS

Stephens, Ransom. "The Future of Multi-Clock Systems." Frequency Controls, Inc. 2007 pp. 1-14.

*Primary Examiner* — Ryan Johnson
(74) *Attorney, Agent, or Firm* — Gary Stanford; James W. Huffman

(57) ABSTRACT

A crystal driver integrated circuit configurable for daisy chaining including an amplifier core, an input pin and an output pin, and a controller that operates the amplifier core in any one of multiple operating modes. The operating modes include an oscillator mode for driving an external crystal coupled between the input and output pins to generate an oscillation signal at a target frequency, and an amplifier mode that amplifies an external oscillating signal provided to the input pin to provide an amplified oscillation signal on the output pin. The amplifier core includes a controllable current source that provides a core bias current to an amplifier having a level that is adjusted depending upon the operating mode and desired amplitude. The operating modes may include a bypass mode in which the amplifier core is disabled. The amplifier may be implemented as either an PMOS amplifier or an NMOS amplifier.

20 Claims, 5 Drawing Sheets

(56) References Cited

U.S. PATENT DOCUMENTS

| | | | |
|---|---|---|---|
| 5,416,445 A * | 5/1995 | Narahara | H03K 3/0307 |
| | | | 331/116 FE |
| 5,453,719 A * | 9/1995 | Narahara | H03B 5/364 |
| | | | 326/58 |
| 5,900,787 A * | 5/1999 | Yoshimura | G06F 1/04 |
| | | | 331/108 A |
| 5,912,594 A | 6/1999 | Burkhard | |
| 6,094,105 A | 7/2000 | Williamson | |
| 6,097,257 A | 8/2000 | Kadowaki et al. | |
| 6,133,801 A | 10/2000 | Tanaka | |
| 6,653,908 B1 | 11/2003 | Jones | |
| 6,696,899 B2 | 2/2004 | Ruffieux | |
| 6,782,485 B2 * | 8/2004 | Takai | G06F 1/08 |
| | | | 327/18 |
| 7,034,628 B1 | 4/2006 | Lu et al. | |
| 7,348,861 B1 | 3/2008 | Wu et al. | |
| 7,808,334 B2 | 10/2010 | Yoshida et al. | |
| 7,868,710 B1 | 1/2011 | Farahvaash et al. | |
| 7,961,060 B1 | 6/2011 | McMenamy et al. | |
| 8,324,978 B2 * | 12/2012 | Loeda | H03B 5/04 |
| | | | 331/116 FE |
| 8,395,456 B2 | 3/2013 | Badillo et al. | |
| 9,614,509 B1 | 4/2017 | Ahmed | |
| 2004/0169562 A1 | 9/2004 | Novac | |
| 2005/0017812 A1 | 1/2005 | Ashida et al. | |
| 2008/0211592 A1 | 9/2008 | Gaussen | |
| 2009/0002087 A1 | 1/2009 | Toffolon et al. | |
| 2009/0096541 A1 | 4/2009 | Tran | |
| 2009/0121799 A1 | 5/2009 | Ishikawa | |
| 2011/0037527 A1 | 2/2011 | Shrivastava et al. | |
| 2011/0291767 A1 | 12/2011 | Ishikawa et al. | |
| 2012/0242418 A1 | 9/2012 | Takahashi | |
| 2013/0154754 A1 | 6/2013 | Frank | |
| 2014/0035689 A1 | 2/2014 | Ozawa et al. | |
| 2014/0091872 A1 | 4/2014 | Itasaka | |
| 2014/0320223 A1 | 10/2014 | Ozawa et al. | |
| 2016/0072438 A1 | 3/2016 | Fukahori | |
| 2019/0006990 A1 | 1/2019 | Marques et al. | |
| 2019/0006991 A1 | 1/2019 | Marques et al. | |
| 2019/0007005 A1 | 1/2019 | Marques | |
| 2019/0007012 A1 | 1/2019 | Marques | |

* cited by examiner

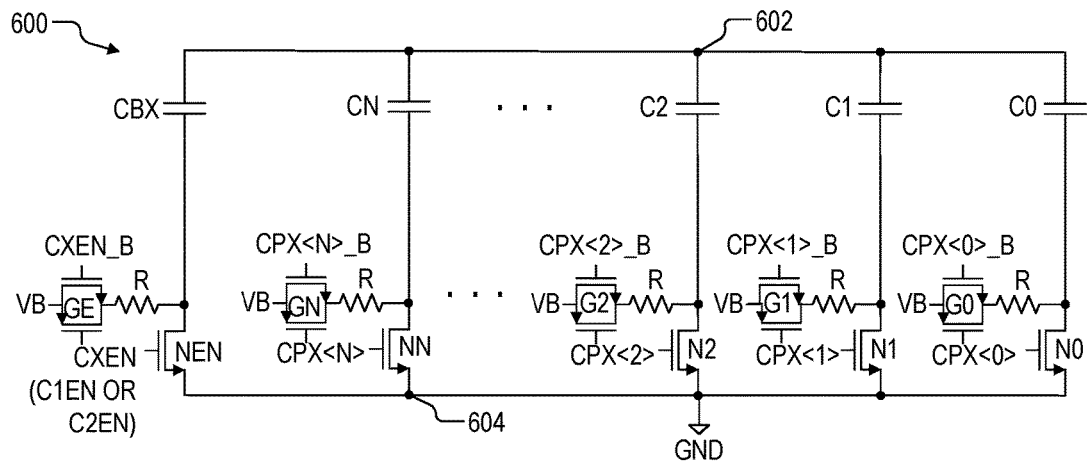
FIG. 6
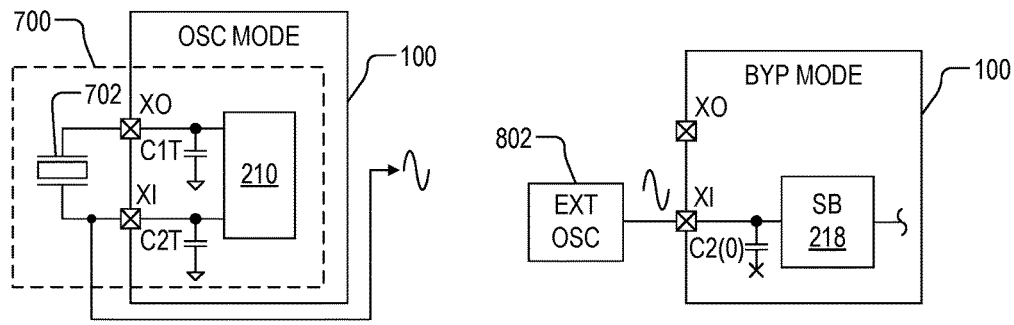
FIG. 7
FIG. 8
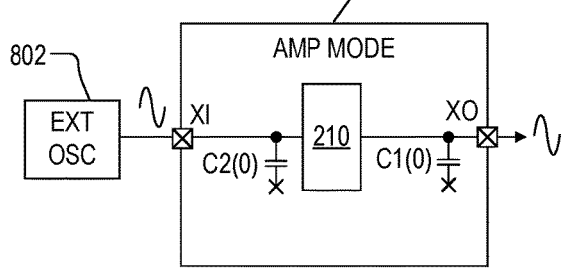
FIG. 9

CRYSTAL DRIVER CIRCUIT CONFIGURABLE FOR DAISY CHAINING

CROSS REFERENCE TO RELATED APPLICATION(S)

This application claims the benefit of U.S. Provisional Application Ser. No. 62/527,461, filed on Jun. 30, 2017, which is hereby incorporated by reference in its entirety for all intents and purposes.

This application is related to the following U.S. Patent Applications which are hereby incorporated by reference in their entireties for all intents and purposes.

| SERIAL NUMBER | FILING DATE | TITLE |
| --- | --- | --- |
| 15/639,038 | Jun. 30, 2017 | CRYSTAL AMPLIFIER WITH ADDITIONAL HIGH GAIN AMPLIFIER CORE TO OPTIMIZE STARTUP OPERATION |
| 15/639,137 | Jun. 30, 2017 | CRYSTAL AMPLIFIER WITH RESISTIVE DE-GENERATION |
| 15/639,267 | Jun. 30, 2017 | CRYSTAL DRIVER CIRCUIT WITH CORE AMPLIFIER HAVING UNBALANCED TUNE CAPACITORS |
| 62/527,475 | Jun. 30, 2017 | CRYSTAL DRIVER CIRCUIT WITH EXTERNAL OSCILLATION SIGNAL AMPLITUDE CONTROL |

BACKGROUND OF THE INVENTION

Field of the Invention

The present invention relates in general to crystal oscillators, and more particularly, to a crystal driver circuit that is configurable into multiple operating modes including an amplifier mode that may be used for daisy chaining.

Description of the Related Art

A crystal oscillator uses the mechanical resonance of a crystal to create an electrical sinusoidal signal having a precise frequency. The crystal oscillator includes a crystal amplifier providing a "negative" resistance that cancels losses of the crystal to establish and maintain oscillation. In certain configurations, the crystal amplifier may include an N-channel MOS (NMOS) or a complementary MOS (CMOS) amplifier having an input and output for coupling across the crystal. The crystal may be modeled as a series combination of a motional capacitance, inductance, and resistance, and the crystal amplifier may be modeled as a negative resistance.

In many electronic system configurations, multiple semiconductor chips or integrated circuits may need an accurate clock signal. A crystal oscillator may incorporate a squaring buffer to convert a sinusoidal oscillation signal into a digital clock signal, but delivery of the digital clock signal is problematic because of potential undesired emissions and/or harmonics generated by square-wave type clock signals. Each integrated circuit may incorporate its own crystal amplifier that may be used to drive an external crystal, but this requires multiple crystals.

SUMMARY OF THE INVENTION

A crystal driver integrated circuit configurable for daisy chaining according to one embodiment includes an amplifier core, an input pin and an output pin, and a controller that operates the amplifier core in any one of multiple operating modes based on a mode input. The operating modes include an oscillator mode for driving an external crystal coupled between the input and output pins to generate an oscillation signal at a target frequency, and an amplifier mode that amplifies an external oscillating signal provided to the input pin to provide an amplified oscillation signal on the output pin. The amplifier core includes a controllable current source that provides a core bias current to an amplifier, in which the level of the core bias current is adjusted depending upon the operating mode. The operating modes may include a bypass mode in which the amplifier core is disabled. The amplifier may be implemented as either an PMOS amplifier or an NMOS amplifier.

The controller may adjust the current source to provide the core bias current so that the oscillation signal on the input pin has a first target amplitude during the oscillator mode, or may adjust the current source to provide the core bias current so that the amplified oscillation signal on the output pin has a second target amplitude during the amplifier mode. The first and second target amplitudes may be equal.

The controller may disable a first tune capacitor coupled to the amplifier output node and may disable a second tune capacitor coupled to the amplifier input node during the amplifier mode. The controller may disable the tune capacitor coupled to the amplifier input node during the bypass mode. The crystal driver integrated circuit may include a memory, in which the controller may use a first stored value to adjust the current source to set the core bias current during the oscillator mode, and may use a stored second value to adjust the current source to set the core bias current during the amplifier mode.

The crystal driver integrated circuit may include a select circuit and a level detector. The select circuit has an output that conveys a selected one of the amplifier input node and the amplifier output node based on a select input. The level detector has an input coupled to the output of the select circuit and has an output providing a level value to the controller. The controller controls the select input of the select circuit to select the amplifier input node to set a level of the core bias current for the oscillator mode, and controls the select input of the select circuit to select the amplifier output node to set a level of the core bias current for the amplifier mode.

A crystal driver daisy chain configuration according to one embodiment includes multiple crystal driver integrated circuits coupled in a daisy chain configuration, in which at least one crystal driver integrated circuit is operated in the amplifier mode having an output pin providing an amplified oscillation signal to an input pin of at least one other crystal driver integrated circuit. The crystal driver daisy chain may include a crystal oscillator providing an oscillation signal to an input pin of one of the crystal driver integrated circuits operated in the amplifier mode. The crystal oscillator may be a first crystal driver integrated circuit operated in the oscillator mode having an input pin providing the oscillation signal.

Each of the crystal driver integrated circuits in the daisy chain configuration may be operated in the amplifier mode, including a first receiving an external oscillation signal at its input and providing a first amplified signal at its output, and a last receiving a last amplified oscillation signal. Intermediate crystal driver integrated circuits may be included, each receiving an amplified oscillation signal at its input and providing an amplified oscillation signal at its output. One or more crystal driver integrated circuits operated in the bypass mode may have its input pin coupled to receive an amplified oscillation signal from any of the crystal driver integrated circuits operated in the amplifier operating mode.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 6 is a simplified schematic diagram of an adjustable tune capacitor that may be used as either one or both of the tune capacitors of FIG. 3.

FIG. 7 is a simplified block diagram illustrating the IC of FIG. 1 configured to operate in an oscillator mode including an external crystal, collectively forming a crystal oscillator.

FIG. 8 is a simplified block diagram illustrating the IC of FIG. 1 configured to operate in a bypass mode.

FIG. 9 is a simplified block diagram illustrating the IC of FIG. 1 configured to operate in an amplifier mode.

DETAILED DESCRIPTION

The inventor has recognized the need to share an oscillation signal among multiple semiconductor chips or integrated circuits. He as therefore developed a crystal driver circuit that is configurable to operate in an amplifier mode that may be used for daisy chaining multiple integrated circuits. The crystal driver circuit includes a crystal amplifier with an amplifier input and an amplifier output which may be coupled across a crystal to form a crystal oscillator. In order to facilitate sharing of an oscillation signal generated by another crystal amplifier or external oscillator, the crystal amplifier may be configured instead to operate in the amplifier mode providing an amplified oscillation signal to drive additional integrated circuits. Rather than connecting to a crystal, a crystal amplifier configured in the amplifier mode amplifies an external oscillation signal received at its amplifier input and provides the amplified oscillation signal at its output. The amplifier mode converts the crystal amplifier into a buffer that may be used to drive additional integrated circuits with reduced distortion. A level detector and controller may be included to adjust a core bias current of an amplifier core to ensure that the amplitude of the amplified oscillation signal is at a target level.

Figure 1:
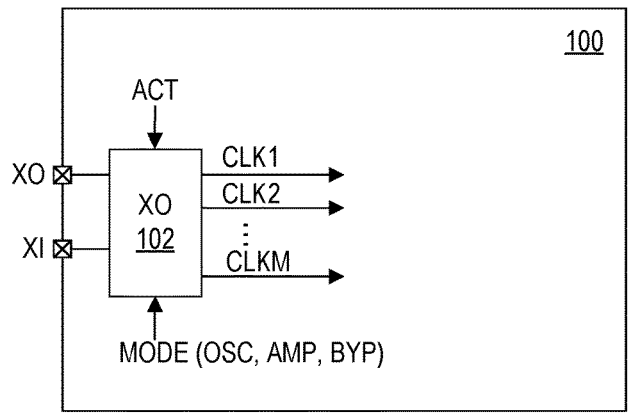
FIG. 1 is a simplified block diagram of an integrated circuit (IC) including a crystal oscillator (XO) system implemented according to one embodiment of the present invention.

FIG. 1 is a simplified block diagram of an integrated circuit (IC) 100 including a crystal oscillator (XO) system 102 implemented according to one embodiment of the present invention. The illustrated IC 100 is shown in simplified form including the XO system 102, which is provided to generate a number "M" of clock signals, shown as CLK1, CLK2, . . . , CLKM, in which M is any positive integer greater than 0. In one embodiment, the IC 100 may incorporate only the XO system 102 as part of a clock semiconductor chip or the like. Although the clock signals CLK1-CLKM may be provided off chip via corresponding pins or interfaces or the like, these signals are digital clock signals in square-wave format that may cause unwanted emissions and/or harmonics. Although not shown, the IC 100 may incorporate additional circuitry for implementing one or more desired electronic functions that may use one or more of the clock signals CLK1-CLKM, such as according to any of various wired or wireless communication applications. Wireless applications may include, for example, Bluetooth®, Zigbee, Wi-Fi, etc. Other functional circuit blocks and circuits may be included for particular applications, but are not shown as not necessary for a full and complete understanding of the present invention. The IC 100 may be mounted on a printed circuit board (PCB) (not shown), a module (not shown), or the like as part of a larger electronic system.

In one embodiment, the XO system 102 may be maintained in a power-down or standby mode when not being used. In the illustrated configuration, the IC 100 provides an activation signal ACT which is asserted to activate or enable the XO system 102 and negated to place the XO system 102 into a standby mode. The IC 100 also provides a MODE signal to the XO system 102 for placing the XO system 102 including any one of multiple operating modes as further described herein. The XO system 102 may be coupled to an external device via an amplifier output pin XO and/or an amplifier input pin XI. As described further herein, for example, MODE indicates an oscillator (OSC) mode, in which the XO system 102 interfaces an external crystal 702 (FIG. 7) coupled between XI and XO. In the OSC mode, the XO system 102 develops an oscillating signal with a target frequency and/or target amplitude. Alternatively, an external oscillator may provide an oscillation signal to XI, and MODE may indicate an amplifier (AMP) mode. In the AMP mode, the external oscillation signal is amplified by the XO system 102 and provided as an output oscillation signal on XO. MODE may further include a bypass (BYP) mode, in which the external oscillation signal may be directly used to develop the clock signals CLK1-CLKM.

The electronic system incorporating the IC 100 may be implemented any one of various configurations, such as a communication device (hand-held, mobile, stationary, etc.), a computer system (laptop, desktop, server system, etc.), a computer peripheral device (e.g., printer, router, etc.), or any other devices that may be networked together via wired and/or wireless communications. The present disclosure contemplates the use of the IC 100 incorporated within a device that may be part of a suite of components of an Internet of Things (IoT) platform or the like. The components or devices may be powered from an external source (e.g., AC outlet or the like), or may be battery-operated. Generally, it is understood that the present invention may be used in any application that uses a crystal oscillator.

Figure 2:
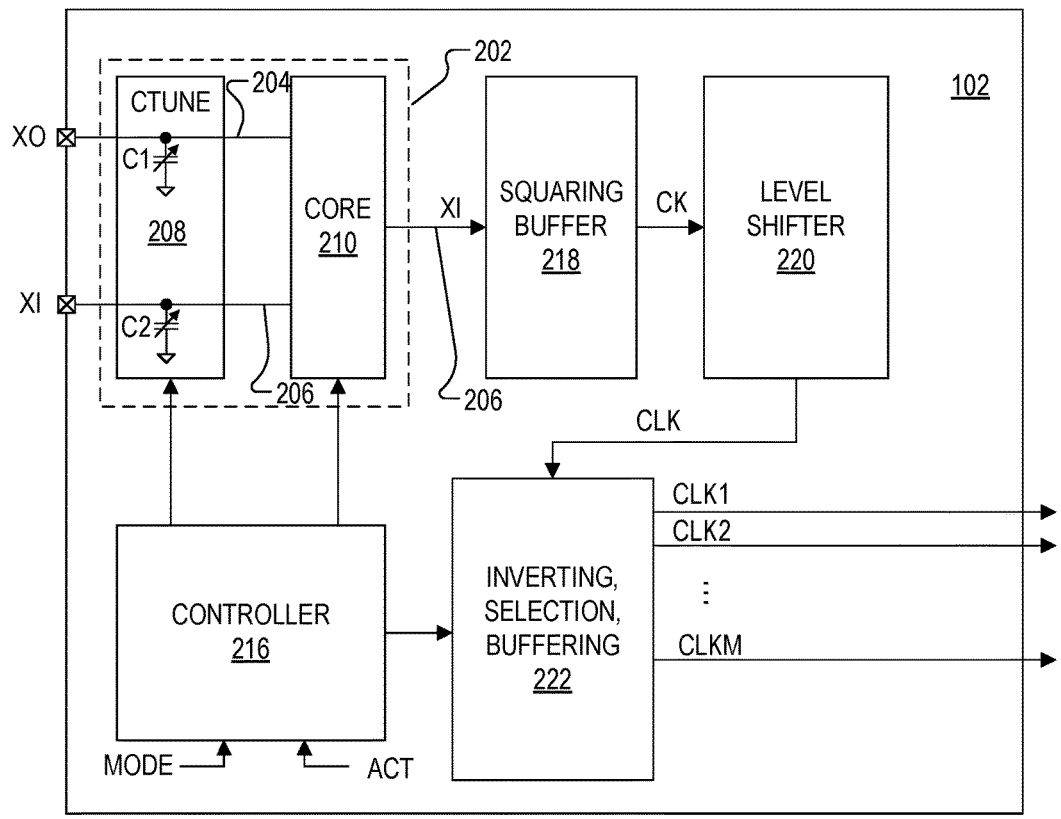
FIG. 2 is a simplified block diagram of the XO system of FIG. 1 incorporating a single crystal amplifier and supporting circuitry.

FIG. 2 is a simplified block diagram of the XO system 102 incorporating a single crystal amplifier 202 and supporting circuitry. XO is internally coupled to an amplifier output node 204 and XI is internally coupled to an amplifier input node 206. As used herein, "XO" generally refers to the XO pin and/or the amplifier output node 204 (unless specifically referencing the XO system 102), and "XI" generally refers to the XI pin and/or the amplifier input node 206. The crystal amplifier 202 includes a tune capacitor (CTUNE) circuit 208 and an amplifier core 210, which are both coupled to the amplifier input and output nodes 204 and 206. The CTUNE circuit 208 includes a first capacitor C1 coupled between the amplifier output node 204 and a reference node and a second capacitor C2 coupled between the amplifier input node 206 and the reference node. The reference node develops a suitable positive, negative or zero voltage level, such as ground (GND). The capacitors C1 and C2 are shown as adjustable capacitors, although fixed tune capacitors are also contemplated. In an alternative embodiment, the tune capacitors may be omitted and otherwise provided externally.

The amplifier input node 206, or XI, is coupled to an input of a squaring buffer 218, which converts an oscillating signal developed on XI, which generally has a sinusoidal waveform, to a squarewave clock signal CK. CK is provided to an input of a level shifter 220, which adjusts the voltage level of CK and provides a corresponding clock signal CLK to an input of an inverting, selection, and buffering circuit 222. The inverting, selection, and buffering circuit 222 incorporates multiple inverters, multiplexers (MUXes), and buffers or the like for providing the clock signals CLK1-CLKM based on CLK, in which CLK1-CLKM may include one or more inverted clock signals. The inverting, selection, and buffering circuit 222 may also convert one or more of the clock signals or inverted clock signals CLK1-CLKM from single-ended to differential format. A controller 216 has corresponding outputs for selecting between each clock signal or its inverted version. One or more of the selected clock signals may be provided directly to selected portions of the IC 100. One or more of the selected clock signals may also be provided to other circuitry (not shown) for further processing, such as clock synthesizers or the like (not shown), for providing one or more modified clock signals (e.g., changes of one or more of frequency, duty cycle, amplitude, etc.) for use by other portions of the IC 100. The particular clock signals or uses thereof are not further described herein.

The controller 216 receives the ACT signal for activating the XO system 102 and for returning the XO system 102 to the standby mode. The controller 216 has an adjust output to adjust the capacitance values of the first and second adjustable capacitors C1 and C2 (when included and when adjustable). The controller 216 has one or more additional outputs for adjusting operation of the amplifier core 210. The controller 216 may also have one or more additional outputs for enabling various blocks and for controlling various parameters of the amplifier core 210.

The controller 218 also receives the MODE signal for controlling operation of the crystal amplifier 202 according to a selected mode of operation as further described herein. The OSC mode is the normal operating mode, in which the crystal amplifier 202 sustains oscillation of the external crystal 702 coupled between XI and XO by generating the appropriate level of negative resistance between XO and XI to develop an oscillation signal. The tune capacitors C1 and C2 collectively form a tune capacitance CT for tuning the oscillating signal to a target frequency in the OSC mode.

In the AMP mode, the amplifier core 210 is instead used as an amplifier that amplifies and/or buffers an external oscillation signal provided via XI to provide an amplified oscillation signal on XO. The amplified oscillation signal may be used to provide an oscillation signal to one or more external devices in a daisy chain configuration as further described herein. In the AMP mode, the capacitance of C1 and C2 may be adjusted or otherwise disabled (e.g., set to zero capacitance). For example, if the external oscillation signal is provided from another IC similar to the IC 100 including an XO system similar to the XO system 102, then C2 may be set to zero capacitance (although parasitic capacitance may still be present on XI). Also, the capacitor C1 may be set, or otherwise adjusted, to control an amplitude of the oscillation signal on XO. The amplitude at XO can also be controlled by the current supplied to the core, or by using both mechanisms together. Alternatively, the external oscillation signal may be provided by a capacitively coupled external clock source, in which case the capacitance of C2 may be adjusted to control the amplitude of the external oscillation signal.

In the BYP mode, the crystal amplifier 202 is effectively shut off or disabled and the external oscillation signal provided on XI is simply provided to the squaring buffer 218 for developing CLK1-CLKM. In the BYP mode, C2 may be disabled or have its capacitance set to zero.

Figure 3:
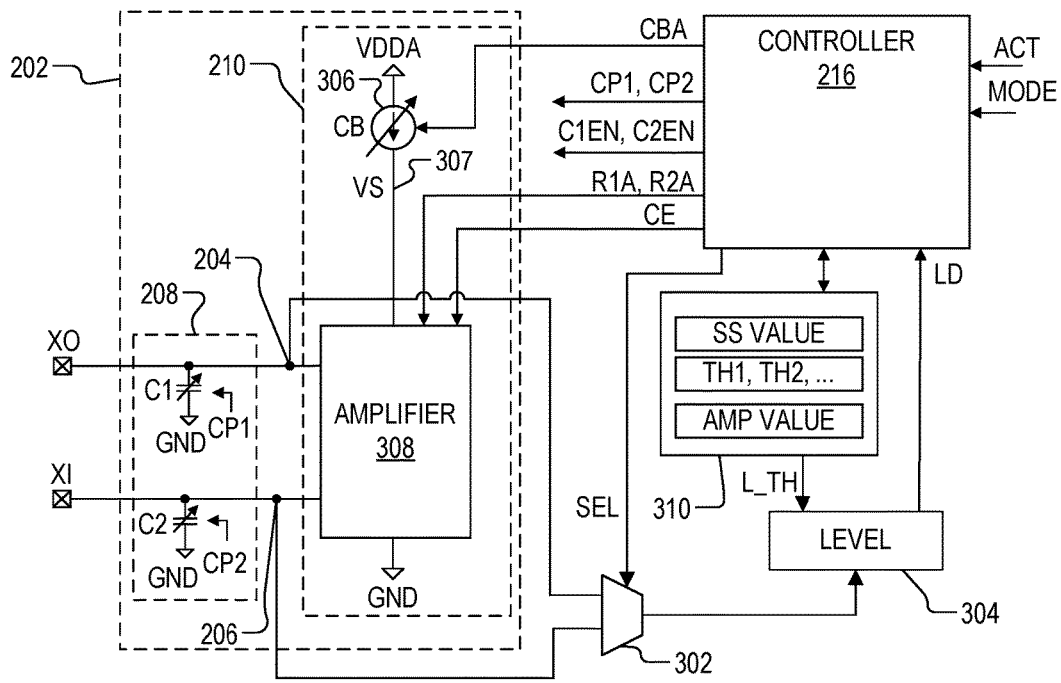
FIG. 3 is a schematic and block diagram of the crystal amplifier of FIG. 2 implemented according to one embodiment of the present invention shown coupled to a controller 216, and further including a select circuit, a level detector, and a memory.

FIG. 3 is a schematic and block diagram of the crystal amplifier 202 implemented according to one embodiment of the present invention shown coupled to the controller 216, and further including a select circuit 302, a level detector 304, and a memory 310. The select circuit 302 is shown as a multiplexer (MUX) or the like, having a pair of inputs for selecting between the XO and XI (i.e., between the amplifier output node 204 and the amplifier input node 206) based on a select input receiving a select signal SEL from the controller 216. The select circuit 302 provides a selected output to an input of the level detector 304. The level detector 304 may be implemented as a peak detector, an amplitude detector, a signal level detector, such as for determining the root-mean-square (RMS) level of an input voltage level, etc. The level detector 304 provides a level detect value LD to an input of the controller 216. It is noted that the level detector 304 may incorporate the select circuit 302 and receive SEL for selecting between XO or XI. In one embodiment, the level detector 304 asserts LD when a level of a selected one of the amplifier input and ouptut nodes XI or XO reaches a level threshold. One or more threshold values TH1, TH2, etc., may be defined. In one embodiment, the memory 310 is accessible by the controller 216 and may be provided to store at least one threshold value, which is also accessible by the level detector 304 via a signal L_TH.

The amplifier core 210 includes an adjustable current source 306 and an amplifier 308. The current source 306 is coupled to a source voltage VDDA, and provides a core bias (CB) current to a source node 307 developing a source voltage VS. The current source 306 includes an adjust input receiving a value CBA from the controller 216 for adjusting the level of the core bias current. The current source 306 provides the core bias current, CB, to the amplifier 308 referenced to GND. The amplifier 308 is coupled to the amplifier output node 204 and the amplifier input node 206. C1 is coupled between XO and GND as previously described and receives an adjust signal CP1 from the controller 216. Similarly, C2 is coupled between XI and GND as previously described an receives an adjust signal CP2 from the controller 216.

The controller 216 may be implemented as a digital state machine or the like in which adjustments of the crystal amplifier 202 are made by providing and/or updating changing digital code values to various components. Although the controller 216 is shown embodied within a single block within the XO system 102, control functions may be distributed at various locations within the XO system 102 and/or within the IC 100. One or more of the digital code values as described herein may be adjustable or otherwise programmable within a corresponding programmable memory or the like (not shown). CBA may be a digital code value provided to the current source 306, in which the controller 216 adjusts CBA to adjust the core bias current provided to the source node 307 accordingly. Likewise, the controller 216 may provide CP1 and CP2 as separate digital control values for adjusting the capacitances of C1 and C2, respectively. The controller 216 may also provide enable signals C1EN and C2EN used in conjunction with CP1 and CP2 to enable or disable one or both of the capacitors C1 and C2. The controller 216 may provide two additional digital code values R1A and R2A, described further below, to the amplifier 308. The controller 216 may also provide a core enable signal CE to the amplifier 308 to facilitate enabling or disabling the amplifier core 210 as further described herein. The controller 216 is also shown receiving ACT and MODE for controlling the mode of operation.

Operation of the crystal amplifier 202 is now briefly described. The crystal amplifier 202 may initially be placed into a standby mode and remains in standby while ACT is negated. When MODE is set to OSC and the crystal 702 is connected between XO and XI, ACT may be asserted to initiate startup, in which case the controller 216 performs a startup routine or process to initialize oscillation. The CE signal is asserted to enable the amplifier 308 as further described herein. C1EN and/or C2EN may be asserted (if negated), and CP1 and CP2 may be adjusted to set C1 and C2 to their tune values. The startup process is not further described, but generally includes starting with a high value of core bias current via CBA until oscillation is achieved. Once oscillation is determined to be achieved, the controller 216 adjusts CBA to reduce the core bias current to a steady state level.

In one embodiment, the steady state current level of the core bias current is known. For example, the controller 216 may store a digital steady state (SS) value in the memory 310 and adjust CBA to the SS value for steady state operation. The memory 310 may be a read-only memory (ROM) or the like. Alternatively, the memory 310 may be a random access memory (RAM) or the like for determining and storing one or more different SS values during operation. In one embodiment, the controller 216 may perform an automatic gain control (AGC) process or the like to determine the steady state level of the core bias current that achieves a signal level at XI or XO, determines the corresponding SS value, and stores the SS value into the memory 310 for future use. When ACT is next negated low, the controller 216 may perform a shutdown operation or the like to place the amplifier core 202 back into the standby mode. Alternatively, ACT may remain asserted or not be provided in configurations in which the crystal amplifier 202 remains enabled.

In the OSC mode of operation, the controller 216 may perform the AGC process upon each startup, such as for determining an adjusted SS value for each operating session, or in response to another stimulus or event, such as a temperature change or any other prompt from other circuitry on the IC 100 or from the electronic system. In one embodiment, the controller 216 asserts SEL to select XI or XO and monitors the signal level via LD provided by the level detector 304 while adjusting CBA. When the level is at a predetermined target level determined by a selected threshold value (e.g., a selected one of TH1, TH2, etc., provided via L_TH), the level detector 304 asserts LD indicating that the signal level has reached the threshold, the controller 216 determines the steady state level for the core bias current.

When MODE indicates the AMP mode of operation, then the amplifier core 210 is instead used to amplify an external oscillating signal received via XI to provide an amplified oscillation signal on XO as an output. CE is asserted to enable the amplifier 308. C1EN and C2EN may be negated and CP1 and CP2 may be set to zero or the like to effectively disable or otherwise remove C1 and C2 from the circuit. Alternatively, C2 may be enabled and its capacitance adjusted to be used as part of a capacitive voltage divider to reduce the amplitude of the external oscillation signal. The controller 216 asserts CBA to cause the current source 306 to provide the core bias current at a level suitable for the AMP mode. The value of CBA for the AMP mode may be predetermined and stored in the memory 310, shown as the AMP value. In the AMP mode, the core bias current may be set to a current level to set the corresponding amplitude of the amplified oscillation signal on XO at a predetermined target level. If the AMP value is not provided or otherwise needs to be determined, then the controller 216 may use the AGC process in a similar manner, except that the controller 216 asserts SEL to select XO and the level detector 304 selects the appropriate threshold value for setting the amplitude of XO at the target level by adjusting CBA. Once determined, the value of CBA may be stored as the AMP value in the memory 310.

The ability to perform the AGC process to adjust the amplitude of the oscillation signal on XO is particularly advantageous for the AMP mode of operation. The core amplifier 210 may drive multiple devices in which each device may present a corresponding load. The AGC process selecting XO for amplitude adjustment may be performed once to adjust the core bias current for a given load level to set the amplitude of the oscillation signal on XO to the target level. If the load changes, or if other operating conditions cause the amplitude on XO to vary, the AGC process may be run again to re-adjust the core bias current to set the signal amplitude of XO back to the target level. Thus, the AGC process may be performed one and/or may be repeated on a periodic basis. It is noted that the AGC process may not be necessary for either of the OSC or AMP modes of operation. In a configuration in which the core bias current is known or predetermined, the core bias current is set by the controller 216 to the appropriate value during operation (such as, for example, by retrieving a stored value in the memory 310).

When MODE indicates the BYP mode of operation, the controller 216 sets CBA to set the core bias current to zero, and negates CE to disable the amplifier 308. The capacitance of C2 may be set to zero, or may be set to a suitable value to control the amplitude of the external oscillating signal provided to the IC 100 via XI.

Figure 4:
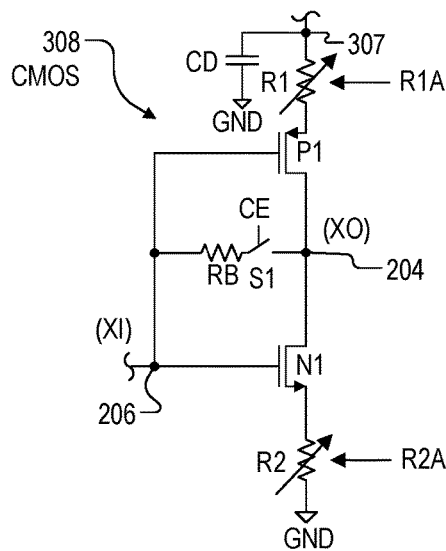
FIG. 4 is a schematic diagram of the amplifier of FIG. 3 according to a CMOS configuration.

FIG. 4 is a schematic diagram of the amplifier 308 according to a CMOS configuration. In this case, the CMOS amplifier 308 includes a P-channel transistor P1, an N-channel transistor N1, a decoupling capacitor CD, a bias resistor RB, an enable switch S1, a first degeneration resistor R1, and a second degeneration resistor R2. CD is coupled between the source node 307 and GND. R1 is coupled between the source node 307 and a source terminal of P1, and has a control input receiving R1A from the controller 216. The gate terminal of P1 is coupled to the amplifier input node 206, and the drain terminal of P1 is coupled to the amplifier output node 204. N1 has its drain terminal coupled to the amplifier output node 204, its gate terminal coupled to the amplifier input node 206, and its source terminal coupled to one terminal of R2. The other terminal of R2 is coupled to GND, and R2 has a control input receiving R2A from the controller 216. RB and S1 are coupled in series between the amplifier input node 206 and the amplifier output node 204.

The CMOS amplifier 308 is enabled by asserting CE to close switch S1 and driving the core bias current to a suitable current level depending upon the mode of operation. The CMOS amplifier 308 is disabled by negating CE to open switch S1 and to set the core bias current to zero. The degeneration resistors R1 and R2 may be set by the controller 216 to suitable values to reduce frequency drift in the OSC mode, or may be set to zero (or shorted) if desired. In the illustrated embodiment, the resistors R1 and R2 are shown as adjustable resistors. In an alternative embodiment, at least one of the resistors R1 and R2 may be fixed. In another alternative embodiment, either one of the resistors R1 and R2 may be eliminated (e.g., replaced by a short). Also, R1 and R2 may have the same resistance, or may have different resistances.

It is noted that each of the transistors described herein, including P1 and N1, are one of at least two different conductivity types, such as either N-type (e.g., N-channel) or P-type (e.g., P-channel). Each transistor includes two current terminals (e.g., drain and source terminals), and a control terminal (e.g., gate terminal). In the illustrated configuration, each transistor may be configured as a MOS transistor or a FET or the like, including any one of various configurations of MOSFETs and the like. For example, the N-type transistors may be NMOS transistors or NFETs, and the P-type transistors may be PMOS transistors or PFETs.

Figure 5:
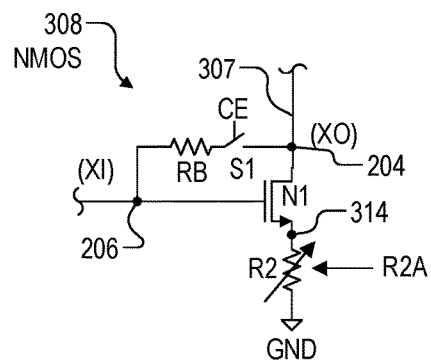
FIG. 5 is a schematic diagram of amplifier of FIG. 3 according to an NMOS configuration.

FIG. 5 is a schematic diagram of amplifier 308 according to an NMOS configuration in which P1, CD, and R1 may be eliminated. The current source 306 is provided for both configurations. For the NMOS amplifier 308, however, node 307 is effectively merged into node 204 since P1 and R1 are eliminated, and the current source 306 provides the core bias current directly to the amplifier output node 204. RB and S1 remain coupled in series between nodes 204 and 206 in the same manner. Operation is substantially similar and only one degeneration resistor, shown as R2, is provided. R2 may be controlled in similar manner and/or eliminated or shorted.

FIG. 6 is a simplified schematic diagram of an adjustable tune capacitor 600 that may be used as either one or both of the capacitors C1 and C2. The tune capacitor 500 includes a pair of capacitor terminals 602 and 604 representing the terminals of the tune capacitor (C1 or C2) that it implements. Generally, the capacitor terminal 604 is coupled to GND for each tune capacitor, and the capacitor terminal 602 for C1 is coupled to the amplifier output node 204 (XO) and the capacitor terminal 602 for C2 is coupled to the amplifier input node 206 (XI).

The tune capacitor 600 includes a series of N+1 capacitors C0, C1, . . . , CN and a corresponding series of N+1 N-channel transistor switches N0-NN, in which each capacitor is coupled in series with the current terminals of a corresponding one of the transistor switches between the capacitor terminals 602 and 604. Thus, C0 is coupled in series with N0 between the terminals 602 and 604, C1 is coupled in series with N1 between the terminals 602 and 604, and so on, each forming one of multiple switch-capacitor pairs coupled in parallel between the capacitor terminals 602 and 604. One terminal of each of the capacitors C0-CN is coupled to the capacitor terminal 602. In each case, the drain terminal of the transistor switch is coupled to the other terminal of a corresponding one of the capacitors, and the source terminal is coupled to the capacitor terminal 604. Each of the transistor switches N0-NN has a gate terminal receiving a corresponding one of N+1 control bits CPX<0>, CPX<1>, CPX<N> from the controller 216, in which "X" is either "1" or "2" for CP1 or CP2, respectively. Thus, CPX<0> is provided to the gate terminal of N0, CPX<1> is provided to the gate terminal of N1, and so on.

A series of N+1 resistors R are further provided, each having one terminal coupled to the junction between the resistor-transistor switch pairs between the capacitor terminals 602 and 604. The other terminal of each resistor R is coupled to one current terminal of a corresponding one of a series of N+1 pass gates (a.k.a., transmission gates) G0, G1, . . . , GN. The other current terminal of each of the pass gates G0-GN is coupled to a bias voltage VB. Each pass gate G0-GN is shown implemented as a parallel combination of a P-channel transistor and an N-channel transistor, in which the source terminal of one of the transistors of each pass gate is coupled to the drain terminal of the other, and vice-versa. Each pass gate includes a P-gate control terminal (gate terminal of internal P-channel transistor) and an N-gate control terminal (gate terminal of internal N-channel transistor). The P-gate control terminal of each pass gate G0-GN receives a corresponding one of the control bits CPX<0>-CPX<N>. The corresponding N-gate control terminal of each pass gate G0-GN receives a corresponding one of inverted control bits CPX<0>_B-CPX<N>_B, in which CPX<0>_B is an inverted version of CPX<0>, CPX<1>_B is an inverted version of CPX<1>, and so on.

An additional "balance" capacitor CBX and transistor switch NEN may be coupled in series between the capacitor terminals 602 and 604, in which CBX is CB1 for C1 and CB2 for C2. An enable signal CXEN is provided to the gate terminal of NEN, in which CXEN is C1EN for C1 and C2EN for C2. An additional resistor R is coupled between the drain terminal of NEN and to one current terminal of another pass gate GE. The other current terminal the pass gate GE is coupled to a bias voltage VB. The P-gate control terminal of the pass gate GE receives CXEN, and the corresponding N-gate control terminal of the pass gate GE receives CXEN B, which is an inverted version of CXEN.

Although not shown, there is an additional parasitic capacitance CPI (not shown) associated with XI and another parasitic capacitance CPO (not shown) associated with XO, in which the parasitic capacitances CPI and CPO may be different (and usually are). The balance capacitor CBX is intended to compensate for the difference in parasitic capacitances of XI and XO, so that the addition of CBX (CB1 for C1 coupled to XO and/or CB2 for C2 coupled to XI) equalizes the capacitances applied to XI and XO before adjustment of C1 and C2. In one embodiment, CBX is only added to one of the adjustable capacitors. For example, the parasitic capacitance CPI on XI may be greater than the parasitic capacitance CPO on XO, so that CB1 is only added to the tune capacitor C1 while CB2 is omitted for C2 (or CB2=0), to equalize capacitance, or CPO+CB1=CPI. In another embodiment CBX is added to both adjustable capacitors with corresponding capacitances to equalize capacitance of XI and XO before adjustment. In either case, a balance capacitor is added to either C1 or C2, or both, to compensate for the parasitic capacitance of XI and XO to an equalized capacitance CEQ, or CB1+CPO=CB2+CPI=CEQ.

In operation of the adjustable tune capacitor 600, each control bit CPX<0>-CPX<N> is asserted high to turn on the corresponding transistor switch N0-NN to connect the corresponding capacitor C0-CN between the capacitor terminals 602 and 604, and to turn off the corresponding pass gate G0-GN. Each control bit CPX<0>-CPX<N> is negated low to turn off the corresponding transistor switch N0-NN to remove or decouple the corresponding capacitor C0-CN from the capacitor terminal 604 and to turn on the corresponding pass gate G0-GN to instead couple the capacitor to VB. For example, when CPX<0> is asserted high, N0 is turned on so that C0 is coupled between the capacitor terminals 602 and 604, while the corresponding pass switch G0 is turned off to isolate C0 from VB. When CPX<0> is negated low, N0 is turned off so that C0 is isolated from the capacitor terminal 604, while the corresponding pass switch G0 is turned on to connect C0 to VB. Thus, the control bits CPX<0>-CPX<N> collectively form a digital control value CPX used to couple selected ones of the capacitors C0-CN in parallel in which the capacitances of the selected capacitors add to select the corresponding capacitance for the tune capacitor C1 or C2. The non-selected ones of the capacitors C0-CN are tied off to the bias voltage to remove and isolate them from the circuit.

The controller 216 enables the adjustable tune capacitor 600 by asserting CXEN high to turn on NEN to couple CBX into the circuit, and by asserting the control bits CPX<0>-CPX<N> to the desired digital control value CPX. The controller 216 disables the adjustable tune capacitor 600, or effectively removes it from the circuit, by negating CXEN low to remove CBX from the circuit, and by asserting the control bits CPX<0>-CPX<N> to a zero value for CPX.

FIG. 7 is a simplified block diagram illustrating the IC 100 configured to operate in the OSC mode including the crystal 702 externally coupled between XO and XI, in which the crystal 702 combined with the crystal amplifier 202 forms a crystal oscillator 700. The controller 216 asserts CE high to enable the amplifier 308, and asserts CBA to cause the current source 306 to drive the core bias current to the appropriate level to establish and maintain oscillation. The controller 216 sets the tune capacitors C1 and C2 to tune capacitances C1T and C2T, respectively, which establish oscillation at the target frequency. Generally, the combined capacitance of the capacitors C1 and C2 should be equal to a tune (or load) capacitance CL, in which CL=C1T*C2T/(C1T+C2T). C1T and C2T may each have the same capacitance, such as both equal to CL*2. C1T and C2T, however, may be different so long as their combined capacitance is CL.

The oscillating signal appearing on XI in the OSC mode may be provided to at least one external device, although the XO system 102 may not support more than one external device.

FIG. 8 is a simplified block diagram illustrating the IC 100 configured to operate in the BYP mode. An external oscillator 802 provides an oscillating signal to the XI input of the IC 100. The controller 216 negates CE low to disable the amplifier 308 and sets CBA so that the core bias current is zero. This effectively disables the amplifier core 210. The tune capacitor C2 is set to zero; in particular, C2EN is negated low to turn off NEN and C2=0. The oscillating signal from the external oscillator 802 is provided to the squaring buffer 218 for generating the CLK1-CLKM signals as previously described. It is noted that the external oscillator 802 may be implemented as the IC 100 in OSC mode as shown in FIG. 7. The external oscillator 802 may also be a temperature compensated crystal oscillator (TCXO) or the like, which asserts the oscillation signal at the target amplitude.

FIG. 9 is a simplified block diagram illustrating the IC 100 configured to operate in the AMP mode. The external oscillator 802 provides the external oscillation signal to XI and C2 is set to zero similar to that described for FIG. 8. In this case, however, the controller asserts CE high to enable the amplifier 308 and provides CBA so that the current source 306 provides a suitable core bias current to operate the amplifier core 210. Although the amplifier core 210 is enabled in similar manner as the OSC mode, it is not used for establishing oscillation using the external crystal 702, but instead is used to amplify or otherwise buffer the external oscillation signal to XO. C1 may also be set to zero.

The AMP mode of operation is particularly useful for daisy chain configurations. The OSC mode provides a method of generating an oscillation signal, but not necessarily for sharing that oscillation signal for more than one other device, such as one other IC configured in the BYP mode as shown in FIG. 8. When the amplifier core 210 is configured for the AMP mode, it serves as a buffer for driving multiple ICs as further described herein. It is noted that the "amplified" oscillation signal at the XO output of the IC 100 configured to operate in the AMP mode does not mean that the amplitude (e.g., voltage level) of the oscillation signal is greater; instead, the signal is amplified in the sense that the IC 100 provides a greater drive capacity to drive the input of multiple external devices as further described herein.

Figure 10:
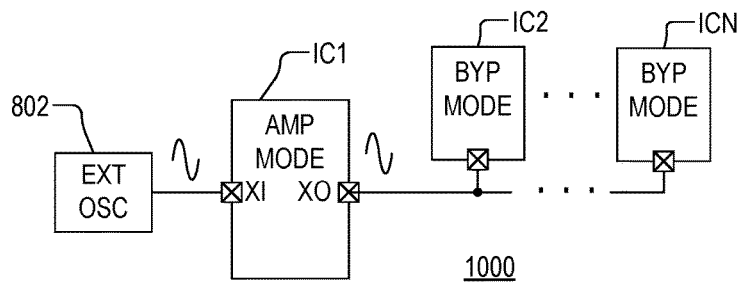
FIG. 10 is a simplified block diagram of a daisy chained configuration of a set of "N" ICs according to one embodiment of the present invention.

FIG. 10 is a simplified block diagram of a daisy chained configuration 1000 of a set of "N" ICs IC1, IC2, IC3, . . . , ICN according to one embodiment of the present invention. The external oscillator 802 provides an oscillation signal to the XI input of the first IC IC1, which is configured in the AMP mode having its XO pin providing an amplified oscillation signal. The amplified oscillation signal is provided to the XI pin of the remaining ICs IC2, . . . , ICN configured in the BYP mode. As previously described in relation to FIG. 8, the external oscillator 802 may be implemented as the IC 100 in OSC mode as shown in FIG. 7, or may be a TCXO, or any other suitable oscillator. In this case, IC1 uses the external oscillation signal for itself and provides an amplified oscillation signal for use by each of the remaining ICs IC2-ICN.

Figure 11:
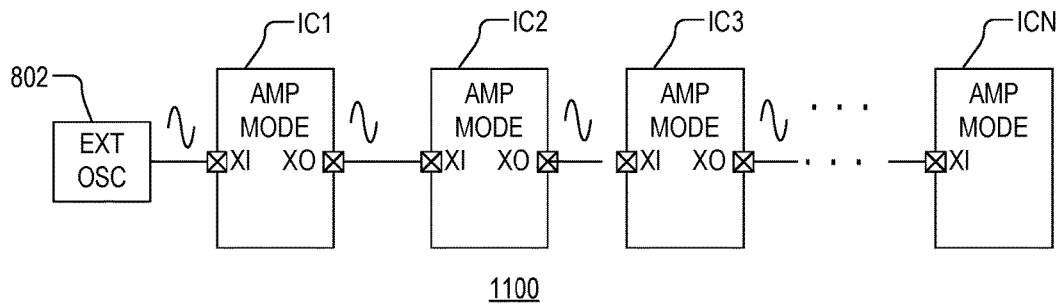
FIG. 11 is a simplified block diagram of a daisy chained configuration of a set of "N" ICs according to another embodiment of the present invention.

FIG. 11 is a simplified block diagram of a daisy chained configuration 1100 of a set of "N" ICs IC1, IC2, IC3, . . . , ICN according to another embodiment of the present invention. The external oscillator 802 provides an oscillation signal to the XI input of the first IC IC1, which is configured in the AMP mode having its XO pin providing an amplified oscillation signal in a similar manner as in the chained configuration 1000. In this case, however, each of the remaining ICs IC2, . . . , ICN are also configured in the AMP mode. Thus, the amplified signal from the XO pin of IC1 is provided to the XI pin of IC2, having its XO pin providing another amplified signal to the XI pin of IC3, and so on up to the last ICN receiving an amplified oscillation signal via its XI pin. In this case, IC1 may use the external oscillation signal for itself and provides an amplified oscillation signal to IC2, which may use the amplified oscillation signal from IC1, but which also generates another amplified oscillation signal for IC3, which may use the amplified oscillation signal from IC2 for itself and which further provides another amplifed oscillating signal at its XO output, and so up to ICN, which receives an amplified oscillation signal at its XI input. In this case, a string of ICs in the AMP mode may include any number of ICs since each is only loaded by the next IC in the chain.

Figure 12:
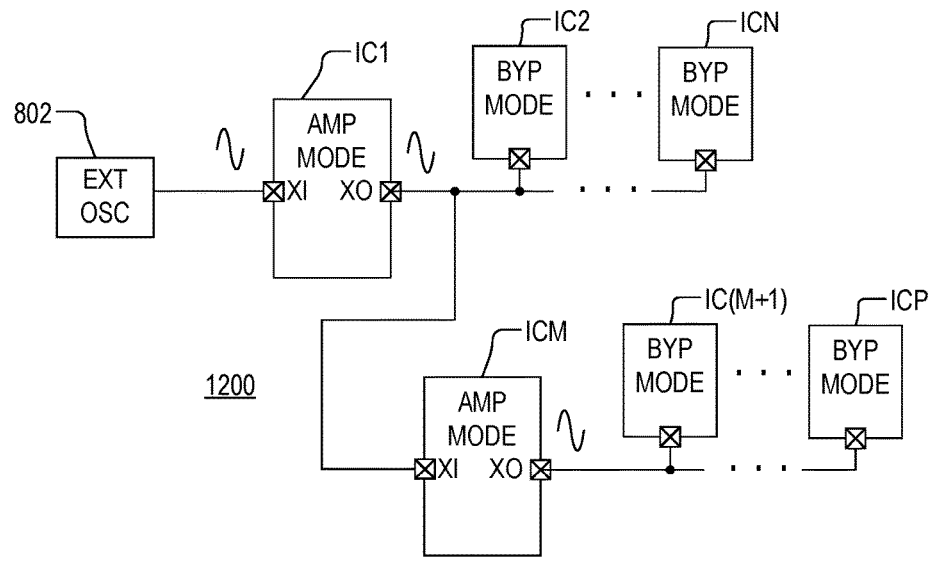
FIG. 12 is a simplified block diagram of a daisy chained configuration of a first set of "N" ICs and a second set of "P" ICs according to another embodiment of the present invention.

FIG. 12 is a simplified block diagram of a daisy chained configuration 1200 of a first set of "N" ICs IC1-ICN and a second set of "P" ICs ICM, IC(M+1), . . . , ICP according to another embodiment of the present invention. IC1-ICN in FIG. 12 are configured in substantially the same manner as for the chained configuration 1000. ICM is configured in the AMP mode, and the remaining ICs IC(M+1), . . . , ICP, each configured in the BYP mode. The amplified oscillation signal from IC1 is also provided to the XI pin of ICM, and the XO pin of ICM provides another amplified oscillation signal to the XI pin of the remaining ICs IC(M+1)-ICP. The chained configuration 1200 illustrates that combinations of chains may be implemented. Similar to the chained configuration 1000, the ICs IC2-ICN are driven by IC1, which also drives the input of ICM. ICM, in turn, drives the remaining ICs IC(M+1)-ICP. In any configuration in which loading becomes an issue in any subchain, an IC in that chain may be configured in the AMP mode and used to drive additional ICs. It is also noted that IC1 may drive additional ICs (not shown) configured in the AMP mode (similar to ICM), in which each of the additional AMP mode ICs may each drive one or more additional ICs (not shown) configured in the BYP mode (i.e., the chain of P ICs may be duplicated as many times as desired). Also, ICM and any one or more of the additional AMP mode ICs may further drive additional ICs in the AMP or BYP modes.

Figure 13:
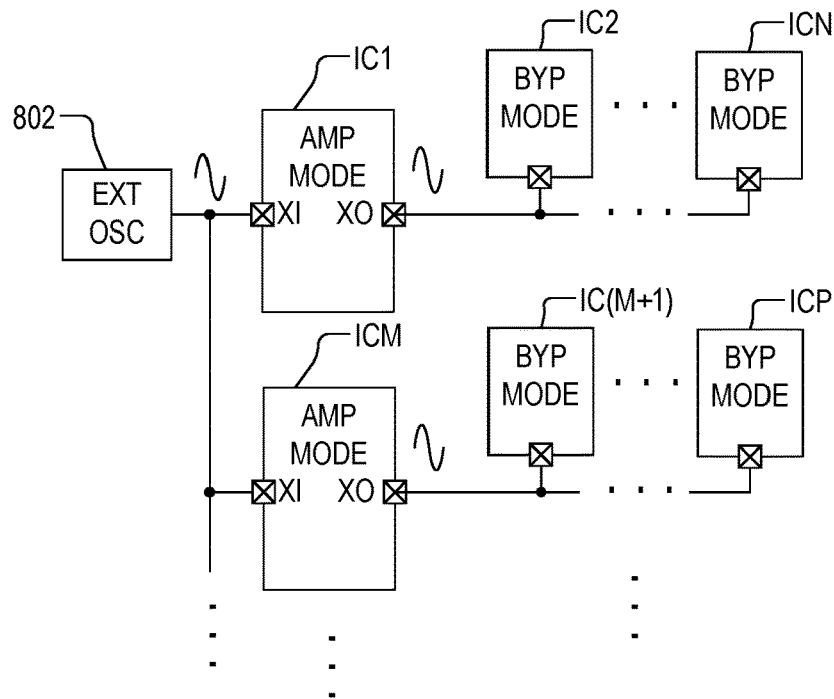
FIG. 13 is a simplified block diagram of a daisy chained configuration of multiple sets of multiple ICs according to another embodiment of the present invention.

FIG. 13 is a simplified block diagram of a daisy chained configuration 1300 of a multiple sets of multiple ICs according to another embodiment of the present invention. The daisy chained configuration 1300 includes the external oscillator 802 providing an oscillation signal to the XI input of the first IC IC1 configured in the AMP mode, which has its XO pin providing an amplified oscillation signal to a first set of N additional ICs IC2, . . . , ICN configured in the BYP mode in a similar manner as the daisy chained configuration 1000. The oscillation signal from the external oscillator 802 is also provided to the XI input of the another IC ICM configured in the AMP mode, in which ICM, in turn, drives another set of ICs IC(M+1)-ICP in a similar manner as the daisy chained configuration 1200. The oscillation signal from the external oscillator 802 may be provided to additional ICs configured in the AMP mode, each driving additional sets of ICs configured in the AMP or BYP modes.

Figure 14:
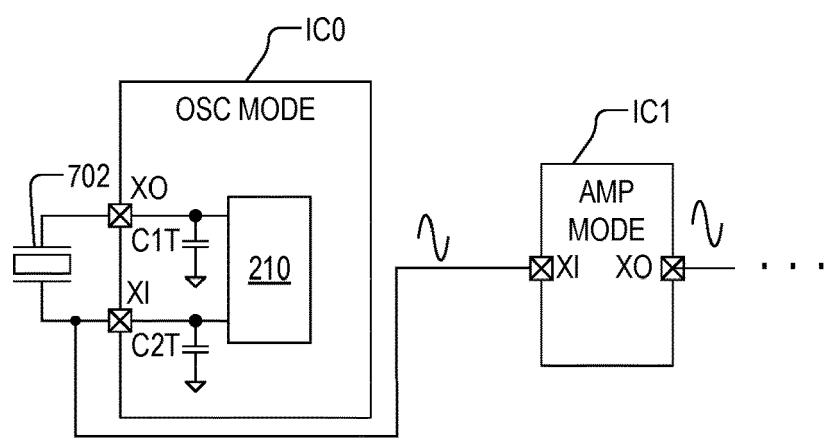
FIG. 14 is a simplified block diagram illustrating a first IC configured to operate in the OSC mode, which provides an oscillation signal to the XI input pin of another IC configured in the AMP mode for use in any of the daisy chained configurations.

FIG. 14 is a simplified block diagram illustrating a first IC IC0 configured to operate in the OSC mode including the crystal 702 externally coupled between XO and XI, which provides an oscillation signal to the XI input pin of another IC IC1 configured in the AMP mode. IC0 incorporates a crystal oscillator (702, FIG. 7) generating the oscillation signal, which may be used as the external oscillator 802 in any of the daisy chained configurations 1000, 1100, 1200, 1300, or the like. In the event that the external oscillator 802 is configured as the IC 100 in OSC mode, or IC0, the ICs IC2-ICN and/or ICM-ICP in any of the daisy chain configurations do not load the "master" IC IC0, but instead are driven by IC1. The number(s) N and/or P is only limited by the drive capacity of IC1. The external oscillator 802 may be according to alternative configurations, such as the TCXO or the like.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A crystal driver integrated circuit, comprising:
an amplifier core, comprising:
a controllable current source having an output that provides a core bias current to a source node; and
an amplifier coupled between said source node and a reference node, having an input coupled to an amplifier input node and having an output coupled to an amplifier output node;
an input pin coupled to said amplifier input node and an output pin coupled to said amplifier output node; and
a controller that operates said amplifier core in any one of a plurality of operating modes based on a mode input, including an oscillator mode for driving an external crystal coupled between said input and output pins to generate an oscillation signal at a target frequency, including an amplifier mode that amplifies an external oscillating signal provided to said input pin to provide an amplified oscillation signal on said output pin, and including a bypass mode in which said controller disables said amplifier core.

2. The crystal driver integrated circuit of claim 1, wherein said controller adjusts said current source to provide said core bias current so that said oscillation signal on said input pin has a first target amplitude during said oscillator mode, and wherein said controller adjusts said current source to provide said core bias current so that said amplified oscillation signal on said output pin has a second target amplitude during said amplifier mode.

3. The crystal driver integrated circuit of claim 2, wherein said first and second target amplitudes are equal.

4. The crystal driver integrated circuit of claim 1, wherein during said amplifier mode, said controller disables a first tune capacitor coupled to said amplifier output node and disables a second tune capacitor coupled to said amplifier input node.

5. The crystal driver integrated circuit of claim 1, wherein said controller disables a tune capacitor coupled to said amplifier input node during said bypass mode.

6. The crystal driver integrated circuit of claim 1, wherein said inverting amplifier comprises one of a PMOS amplifier and an NMOS amplifier.

7. The crystal driver integrated circuit of claim 1, further comprising:
a memory that stores a first and second values; and wherein said controller uses said first value to adjust said current source to set said core bias current during said oscillator mode, and uses said second value to adjust said current source to set said core bias current during said amplifier mode.

8. The crystal driver integrated circuit of claim 1, further comprising:
a select circuit having an output that conveys a selected one of said amplifier input node and said amplifier output node based on a select input;
a level detector having an input coupled to said output of said select circuit and having an output providing a level value to said controller; and
wherein said controller controls said select input of said select circuit to select said amplifier input node to set a level of said core bias current for said oscillator mode, and controls said select input of said select circuit to select said amplifier output node to set a level of said core bias current for said amplifier mode.

9. A crystal driver daisy chain configuration, comprising:
a plurality of crystal driver integrated circuits coupled in a daisy chain configuration, each comprising:
an amplifier core, comprising:
a controllable current source having an output that provides a core bias current to a source node; and
an amplifier coupled between said source node and a reference node, having an input coupled to an amplifier input node and having an output coupled to an amplifier output node;
an input pin coupled to said amplifier input node and an output pin coupled to said amplifier output node; and
a controller that operates said amplifier core in any one of a plurality of operating modes based on a mode input, including an oscillator mode for driving an external crystal coupled between said input and output pins to generate an oscillation signal at a resonant frequency, and an amplifier mode that amplifies an external oscillating signal provided to said input pin to provide an amplified oscillation signal on said output pin; and
wherein at least one of said plurality of crystal driver integrated circuits is operated in said amplifier mode having an output pin providing an amplified oscillation signal to an input pin of at least one other one of said plurality of crystal driver integrated circuits.

10. The crystal driver daisy chain configuration of claim 9, further comprising a crystal oscillator providing an oscillation signal to an input pin of one of said plurality of crystal driver integrated circuits operated in said amplifier mode.

11. The crystal driver daisy chain configuration of claim 10, wherein said crystal oscillator comprises a first one of said plurality of crystal driver integrated circuits operated in said oscillator mode having an input pin providing said oscillation signal.

12. The crystal driver daisy chain configuration of claim 9, wherein:
a first one of said plurality of crystal driver integrated circuits is operated in said amplifier mode having an input pin receiving an external oscillation signal and having an output pin providing a first amplified oscillation signal; and
wherein a second one of said plurality of crystal driver integrated circuits is operated in said amplifier mode having an input pin coupled to said output pin of said first one and having an output pin providing a second amplified oscillation signal.

13. The crystal driver daisy chain configuration of claim 9, wherein each of said plurality of crystal driver integrated circuits are operated in said amplifier mode, including a first one having an input pin receiving an external oscillating signal and a last one receiving an amplified oscillation signal.

14. The crystal driver daisy chain configuration of claim 9, wherein said plurality of modes includes a bypass mode in which said controller disables an amplifier core of a crystal driver integrated circuit operated in said bypass mode.

15. The crystal driver daisy chain configuration of claim 14, wherein:
a first one of said plurality of crystal driver integrated circuits is operated in said amplifier mode having an input pin receiving an external oscillation signal and having an output pin providing an amplified oscillation signal; and
wherein a second one of said plurality of crystal driver integrated circuits is operated in said bypass mode having an input pin coupled to said output pin of said first one for receiving said amplified oscillation signal.

16. The crystal driver daisy chain configuration of claim 15, wherein said plurality of crystal driver integrated circuits includes at least one additional crystal driver integrated circuit operated in said bypass mode having an input pin coupled to said output pin of said first one for receiving said amplified oscillation signal.

17. The crystal driver daisy chain configuration of claim 14, wherein:
a first one of said plurality of crystal driver integrated circuits is operated in said amplifier mode having an input pin receiving an external oscillation signal and having an output pin providing a first amplified oscillation signal;
wherein a second one of said plurality of crystal driver integrated circuits is operated in said bypass mode having an input pin coupled to said output pin of said first one for receiving said first amplified oscillation signal; and
wherein a third one of said plurality of crystal driver integrated circuits is operated in said amplifier mode having an input pin coupled to said output pin of said first one for receiving said first amplified oscillation signal and having an output pin providing a second amplified oscillation signal.

18. The crystal driver daisy chain configuration of claim 17, wherein a fourth one of said plurality of crystal driver integrated circuits is operated in said bypass mode having an input pin coupled to said output pin of said second one for receiving said second amplified oscillation signal.

19. The crystal driver daisy chain configuration of claim 14, wherein:
a first plurality of said plurality of crystal driver integrated circuits are each operated in said amplifier mode having an input pin receiving an external oscillation signal and having an output pin providing a corresponding one of a plurality of amplified oscillation signals; and
a second plurality of said plurality of crystal driver integrated circuits are each operated in said bypass mode, each having an input pin for receiving one of said plurality of amplified oscillation signals.

20. A crystal driver integrated circuit, comprising:
an amplifier core, comprising:
a controllable current source having an output that provides a core bias current to a source node; and an amplifier coupled between said source node and a reference node, having an input coupled to an amplifier input node and having an output coupled to an amplifier output node;

an input pin coupled to said amplifier input node and an output pin coupled to said amplifier output node; and a controller that operates said amplifier core in any one of a plurality of operating modes based on a mode input, including an oscillator mode for driving an external crystal coupled between said input and output pins to generate an oscillation signal at a target frequency, and including an amplifier mode in which said amplifier core is operative to amplify an external oscillating signal provided to said input pin to increase a drive capacity of an amplified oscillation signal provided on said output pin.

* * * * *